United States Patent
Garlapati et al.

(10) Patent No.: US 7,253,763 B2
(45) Date of Patent: *Aug. 7, 2007

(54) SWITCHING BETWEEN LOWER AND HIGHER POWER MODES IN AN ADC FOR LOWER/HIGHER PRECISION OPERATIONS

(75) Inventors: Srinivasa H. Garlapati, Fremont, CA (US); Paul Anthony Lettieri, Lake Forest, CA (US); Jason A. Trachewsky, Menlo Park, CA (US); Greg H. Efland, Palo Alto, CA (US); Tom W. Kwan, Cupertino, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/516,302

(22) Filed: Sep. 5, 2006

(65) Prior Publication Data

US 2007/0001889 A1    Jan. 4, 2007

Related U.S. Application Data

(63) Continuation of application No. 10/847,783, filed on May 18, 2004, now Pat. No. 7,116,259.

(51) Int. Cl.
*H03M 1/12* (2006.01)

(52) U.S. Cl. .................................. 341/155; 341/156
(58) Field of Classification Search ................ 341/155, 341/156, 161, 162, 163
See application file for complete search history.

(56) References Cited

U.S. PATENT DOCUMENTS

| | | | |
|---|---|---|---|
| 6,072,791 A * | 6/2000 | Nagase et al. | 370/342 |
| 6,340,944 B1 | 1/2002 | Chang et al. | |
| 6,577,185 B1 | 6/2003 | Chandler et al. | |
| 6,842,478 B1 * | 1/2005 | Ogino | 375/147 |
| 7,009,548 B2 * | 3/2006 | Chiang et al. | 341/161 |
| 2005/0084037 A1 * | 4/2005 | Liang | 375/316 |

* cited by examiner

*Primary Examiner*—Brian Young
(74) *Attorney, Agent, or Firm*—Garlick Harrison & Markison

(57) ABSTRACT

An analog-to-digital converter (ADC) disposed in a data reception path to convert data from an analog format to a digital format is switched between two or more power modes to conserve power when data is not being received. ADC stays in a lower power-lower precision mode until an inbound data is detected, at which time the ADC switches to a higher power-higher precision mode to convert the data. Once data conversion is completed, the ADC switches back to the lower power-lower precision mode to conserve power.

10 Claims, 7 Drawing Sheets

SWITCHING BETWEEN LOWER AND HIGHER POWER MODES IN AN ADC FOR LOWER/HIGHER PRECISION OPERATIONS

CROSS REFERENCE TO RELATED APPLICATION

This application is a continuation of Ser. No. 10/847,783 filed May 18, 2004 now U.S. Pat. No. 7,116,259.

BACKGROUND OF THE INVENTION

1. Technical Field of the Invention

The embodiments of the invention relate to wireless communication systems and, more particularly, to analog-to-digital converters used in such wireless communication systems.

2. Description of Related Art

Communication systems are known to support wireless and wire lined communications between wireless and/or wire lined communication devices. Such communication systems range from national and/or international cellular telephone systems to the Internet to point-to-point in-home wireless networks. Generally, each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication device(s). For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For a wireless communication device to participate in wireless communications, it generally includes a built-in radio transceiver (i.e., receiver and transmitter) or is coupled to an associated radio transceiver (e.g., a station for in-home and/or in-building wireless communication networks, RF modem, etc.). As is known, the transmitter may include a data modulation stage, one or more intermediate frequency (IF) stages, and a power amplifier. The data modulation stage converts raw data into baseband signals in accordance with a particular wireless communication standard. The one or more intermediate frequency stages mix the baseband signals with one or more local oscillator signal(s) to produce RF signals. The power amplifier amplifies the RF signals prior to transmission via an antenna.

As is also known, the receiver is coupled to the antenna and may include a low noise amplifier, one or more intermediate frequency stages, a filtering stage, and a data recovery stage. The low noise amplifier receives inbound RF signals via the antenna and amplifies the signal. The one or more intermediate frequency stages mix the amplified RF signals with one or more local oscillator signal(s) to convert the amplified RF signal into baseband signals or IF signals. The filtering stage filters the baseband or IF signals to attenuate frequencies outside of the bandwidth of the filter to produce filtered signals. The data recovery stage recovers raw data from the filtered signals in accordance with the particular wireless communication standard employed.

Generally, in many wireless devices that operate from a battery, power consumption is a significant concern. Accordingly, employing various techniques to reduce power consumption in the operation of the device may extend its battery life. For example, low supply voltage chips may be utilized in the wireless device. Another method is to allow the display to become inactive after a time out period, if no user activity is noted. Still another technique is to place a processor in a sleep or suspend mode if activity is absent for a specified time period.

Accordingly, a need exists to continually find further techniques to reduce power consumption in a wireless device.

SUMMARY OF THE INVENTION

An apparatus and method to conserve power in an analog-to-digital converter (ADC) when data is not being received. The ADC is disposed in a data reception path to convert data from an analog format to a digital format and is switched between two or more power modes to conserve power when data is not being received. The ADC stays in a lower power-lower precision mode until preamble information for the inbound data is detected. When the start of the preamble is detected, the ADC switches into a higher power-higher precision mode of operation to perform the conversion operation on the inbound data. When the conversion operation is completed, the ADC switches back to the lower power-lower precision mode to conserve power, until the detection of the next preamble.

In one embodiment, the ADC enters into the higher power-higher precision mode of operation by placing the ADC into a high power-high precision mode that converts analog format of the received data into n bits in digital format for high precision conversion, but in which the lower power-lower precision mode of operation places the ADC into a low power-low precision mode that converts the analog format to less than n bits to detect presence of the start of the preamble information. In one embodiment, this operation is achieved by deactivating one or more stages of a pipelined ADC circuit.

In another embodiment, the ADC enters into the higher power-higher precision mode of operation by placing the ADC into a high power-high precision mode that draws current through multiples branches of a multiple-branched current driver for high precision conversion, but in which the lower power-lower precision mode of operation places the ADC into one or more medium power-medium precision modes by turning off or reducing current flow in one or more of the branches to drive the ADC.

DETAILED DESCRIPTION OF THE EMBODIMENTS OF THE INVENTION

Figure 1:
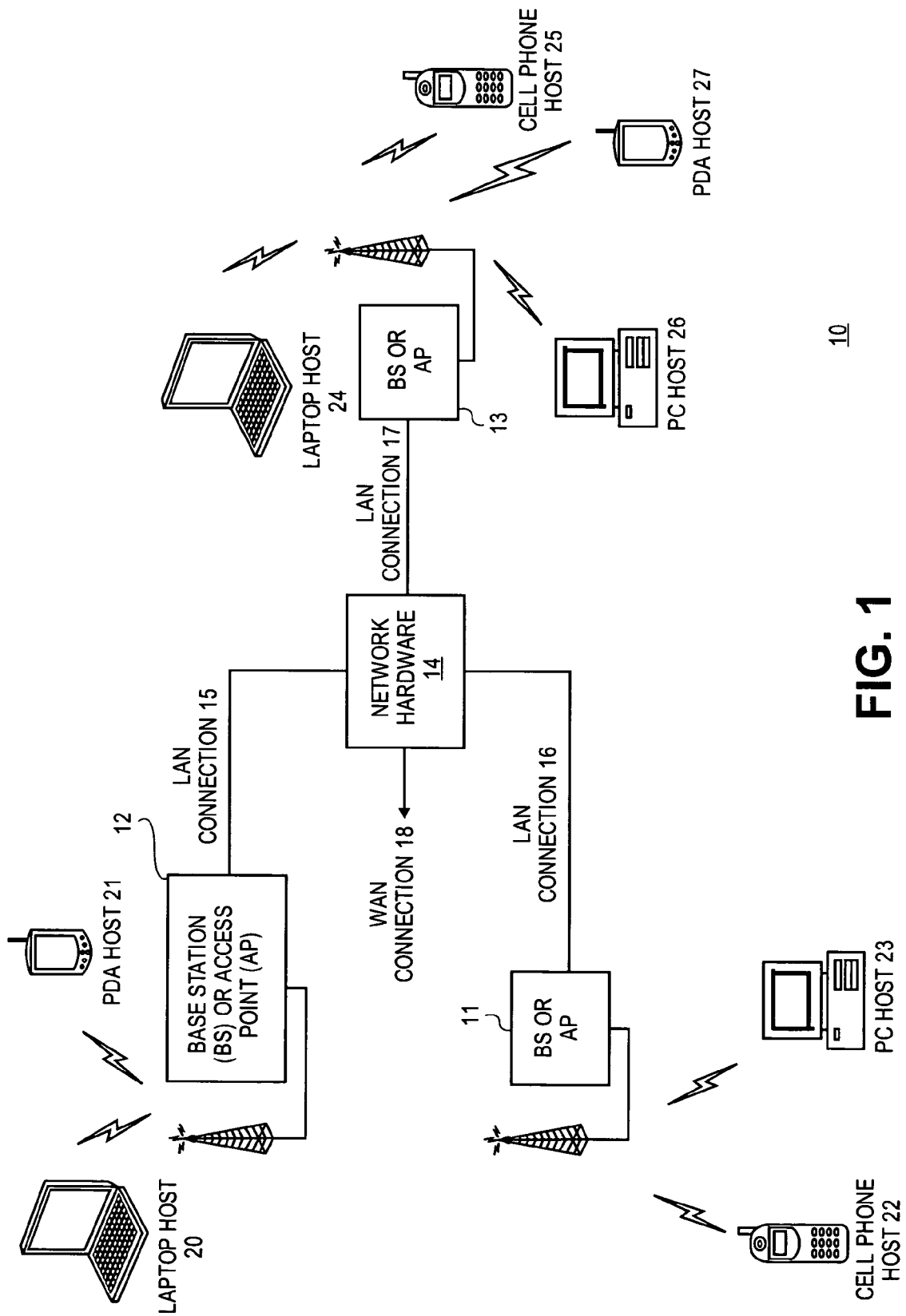
FIG. 1 is a system diagram showing a wireless communication system in which one or more devices may employ an embodiment of the present invention.

The embodiments of the present invention may be practiced in a variety of settings that implement conversion of a RF signal to send and/or receive data. FIG. 1 is a schematic block diagram illustrating a communication system 10 that includes a plurality of base stations (BS) and/or access points (AP) 11-13, a plurality of wireless communication devices 20-27 and a network hardware component 14. Wireless communication devices 20-27 may be laptop host computers 20, 24, personal digital assistant hosts 21, 27, personal computer hosts 23, 26 and/or cellular telephone hosts 22, 25. Communication system 10 may include other types of devices as well.

The base stations or access points (BS/AP) 11-13 may be operably coupled to network hardware 14 via respective local area network connections 15-17. Network hardware 14, which may be a router, switch, bridge, modem, system controller, etc., may provide a wide area network connection 18 for communication system 10. Individual BS/AP 11-13 generally has an associated antenna or antenna array to communicate with the various wireless communication devices in its area. Typically, the wireless communication devices register with a particular BS/AP 11-13 to receive services within communication system 10. For direct connections (i.e., point-to-point communications), wireless communication devices may communicate directly via an allocated channel.

Typically, base stations are used for cellular telephone systems and like-type systems, while access points are used for in-home or in-building wireless networks. Regardless of the particular type of communication system, an individual wireless communication device includes a built-in radio and/or is coupled to a radio. The radio may include a linear amplifier and/or programmable multi-stage amplifier to enhance performance, reduce costs, reduce size, and/or enhance broadband applications. It is to be noted that an embodiment of the invention may be implemented in one or more of the various units 11-13 and/or 20-27 of FIG. 1.

Figure 2:
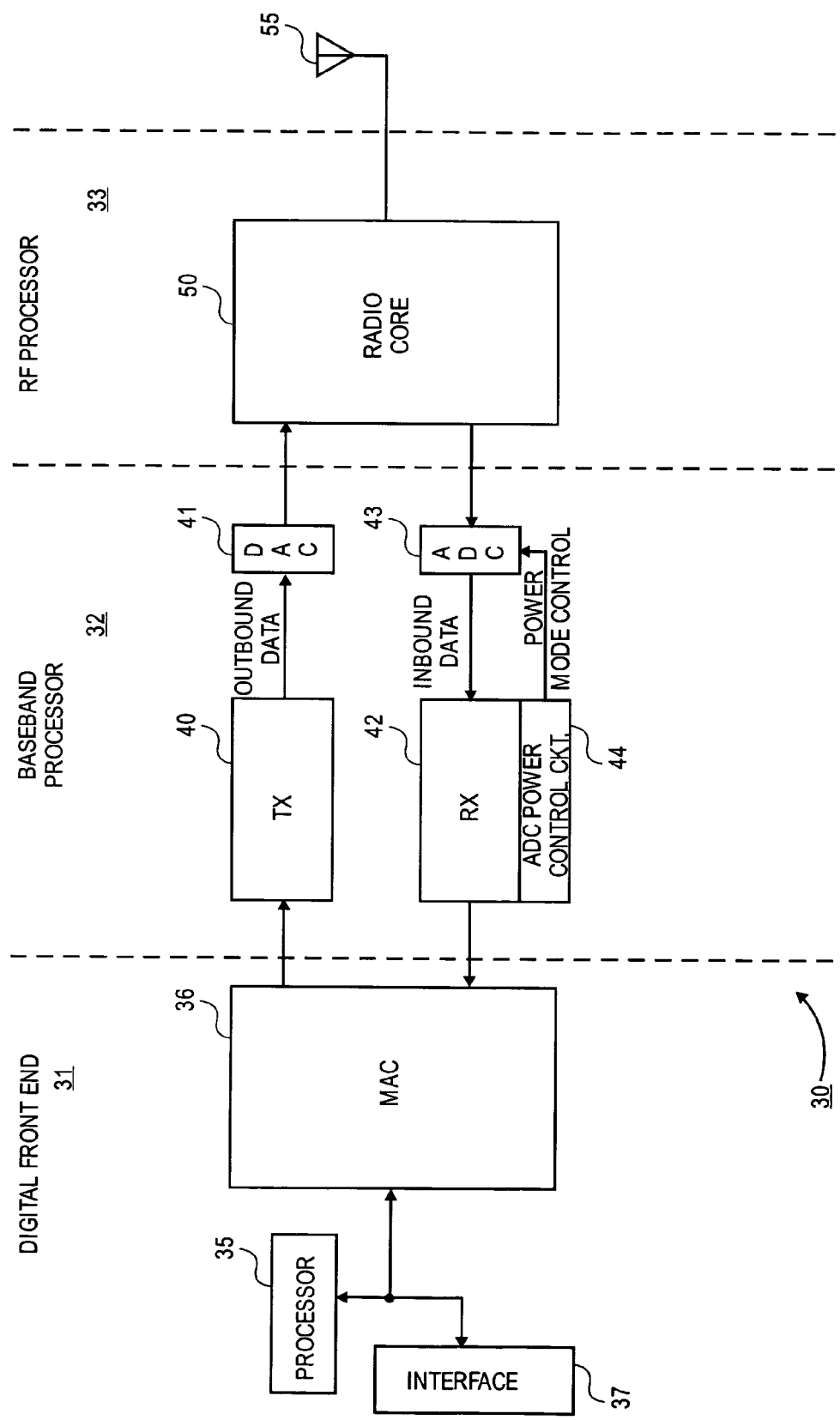
FIG. 2 is a block schematic diagram showing portions of a device utilized for wireless communication, in which an embodiment of the present invention is implemented in a baseband processor portion of the device.

FIG. 2 is a schematic block diagram illustrating an example embodiment of a device 30 that may be readily implemented in one or more of the wireless communication devices 20-27, as well as in BS/AP 11-13. Generally, for cellular telephone hosts, device 30 is a built-in component. For personal digital assistants hosts, laptop hosts, and/or personal computer hosts, device 30 may be built-in or may be an externally coupled component.

As shown in the embodiment of FIG. 2, device 30 includes a digital front end 31, baseband processor 32 and radio frequency (RF) processor 33. Digital front end 31 may be comprised of a variety of devices and circuits to process signals and interact with a user. Generally, a user inputs data through a keyboard, keypad, microphone, etc. and obtains data output through a visual display, speaker, headphone, etc. Data to be transmitted from device 30 is first processed by the digital front end 31 and sent as digital data to baseband processor 32. Likewise, in a receive mode, digital data output from baseband processor 32 is coupled to digital front end 31 to be processed for use by the user.

In the example device 30, digital front end 31 includes a host processor 35, media access control (MAC) unit 36 and interface 37. Although not shown, one or more input/output (I/O) connections may be coupled to processor 35 and/or MAC 36. I/O connections, such as Peripheral Component Interconnect (PCI), Personal Computer Memory Card International Association (PCMCIA), as well as others, may be coupled to interface 37. It is to be noted that other connection(s) and/or bus(es) may be coupled to interface 37, processor 35 and/or MAC 36.

MAC 36 generally provides the node address(es) for various nodes on the network, if device 30 is coupled onto a network. A host processor, such as processor 35, may be present to control the operation of the digital front end 31 and/or to process inbound and/or outbound data, if such data processing is needed prior to inputting data to the baseband processor 32 and/or outputting data to the user. Therefore, in a typical operation, data input from a user is received by the digital front end 31 and sent to baseband processor 32 when outbound data is ready to be transmitted. Similarly, when data is received by wireless communication, the inbound digital data output from the baseband processor 32 is coupled to digital front end 31 to be made available for the user. It is to be noted that other embodiments for the digital front end may include additional components, such as memory, processing modules or other interfaces. Furthermore, digital front end 31 may be part of a stand alone device, so that coupling to a network may not be needed. In other instances, digital front end 31 may perform corresponding communication functions in accordance with a particular standard, such as a cellular telephone standard.

Baseband processor 32 includes a transmitting (Tx) module 40 to receive digital data from digital front end 31 and process the digital data for conversion as outbound signals to RF processor 33. Likewise, baseband processor 32 also includes a receiving (Rx) module 42 to receive inbound signals from RF processor 33 and convert the inbound signals as data for output to the digital front end 31. Typically, in wireless applications, the Tx module 40 resides in the transmitting path and converts the digital signal from digital front end 31 to an in-phase component I and quadrature component Q pursuant to a known digital modulation technique. The outbound signal is then coupled to a digital-to-analog converter (DAC) 41 to convert the outbound signal from digital format into an analog signal. The analog signal is then coupled to RF processor 33 as modulation signals. It is to be noted that DAC 41 may be comprised of one or more DAC units or stages to provide the digital-to-analog conversion.

On the receiving path, the inbound RF signal undergoes signal conversion in RF processor 33. Typically, in wireless applications, the converted analog signal has Q and I components. The analog signal is then coupled to an analog-to-digital converter (ADC) 43 for conversion from analog format into a digital format as part of demodulation of the inbound signal. ADC 43 may be comprised of one or more ADC stage(s) to provide the analog-to-digital conversion. The digital signal is then coupled to Rx module 42. Rx module 42 receives the inbound digital signal (typically, Q and I components) and retrieves data for output to digital front end 31.

It is to be noted that a variety of circuitry may be utilized for Tx and Rx modules to perform the necessary signal conversions, including circuitry known in the art. Furthermore, although not shown, other components may be resident in baseband processor 32, such as memory. What is to be noted is that Tx module 40 receives digital data from digital front end 31, performs data conversion and sends an outbound digital signal for digital-to-analog conversion by DAC 41, which is then used for modulation of a RF carrier in RF processor 33. Likewise, in the receiving path, RF processor 33 performs the RF conversion to generate an analog signal, which is converted to digital format by ADC 43. Rx module 42 receives the output of ADC 43 and performs the conversion to generate data output to digital front end 31.

Baseband processor 32 may also include an ADC power control circuit, such as ADC power control circuit 44. Power control circuit 44 sends a control signal to ADC 43 to control modes of operation of ADC 43. The control signal from control circuit 44 to ADC 43 is noted as power mode control in FIG. 2, since this signal controls the operation of ADC 43 that is associated with the power consumption by ADC 43. As will be described later, in one state of the power mode control signal, ADC 43 is placed into a higher power, higher precision state and in a second state of this signal, ADC 43 is placed into a lower power state, which may result in lower precision.

RF processor 33 includes a radio core 50 for transmitting and receiving modulated RF signals. Radio core 50 receives the analog signal from baseband processor 32 and after filtering, uses the analog signal to modulate a carrier at a higher frequency, generally referred to as RF. A variety of modulation techniques may be employed, including modulation techniques known in the art. The baseband frequency may be converted directly to RF or one or more intermediate frequency (IF) conversion stage(s) may be employed. A typical technique is to employ a local oscillator and a mixer to perform the up-conversion operation to generate a modulated RF envelope. The RF signal is typically amplified and transmitted from an antenna 55.

Radio core 50 also receives RF signals at a carrier frequency through antenna 55 and employs a technique in reverse to demodulate a baseband signal from the received RF signal. Again, one or more IF conversion stages may be employed with a local oscillator, if direct conversion from RF to baseband frequency is not used. A low noise amplifier may be employed to amplify the received RF signal. A variety of conversion techniques may be employed, including conversion techniques known in the art. The baseband components are then output to the baseband processor 32.

It is to be noted that various other components may be employed within radio core 50 to perform functions for modulation and demodulation. These components may include memory components, various filters (such as low-pass filters), low noise amplifiers to increase the gain of the received signal, power amplifiers to boost the power of the transmitted signal, local oscillators and mixers to perform the frequency conversion, as well as a switching controller at the antenna to switch between transmit and receive modes. Generally, a single antenna is utilized. However, in other embodiments, separate antennae may be used for transmitting and receiving.

It is also to be noted that the Tx and Rx modules 40, 42 of baseband processor 32 may also perform one or more operations including, constellation mapping/demapping, encoding/decoding, scrambling/unscrambling, as well as further frequency conversion. Generally, a particular wireless communication standard (e.g., IEEE 802.11, Bluetooth, etc.) is employed by the Tx and Rx modules. The Tx and Rx modules may be separate units or may employ shared units.

Furthermore, it is to be noted that device 30 of FIG. 2 may be implemented using one or more integrated circuits (ICs). For example, the digital front end may be implemented on one integrated circuit (IC), baseband processor 32 on another IC and RF processor 33 on still another IC. Alternatively, two of the units 31, 32, 33 or even all three of the units may be combined in the same IC. In some instances, external components (e.g., external memory) may be utilized in the operation of device 30.

Generally, device 30 operates in half-duplex mode. That is, the radio core 50 either transmits data or receives data, but not both simultaneously. In the half-duplex mode, data is sent from the Tx module 40 to radio core 50 in the transmit mode of operation or data is sent from the radio core 50 to Rx module 42 in the receive mode of operation. In the transmit mode, DAC 41 is utilized, but not ADC 43. In the receive mode ADC 43 is utilized, but not DAC 41. Accordingly, ADC 43 need not be fully operational when inbound signal is not present. Furthermore, it is to be noted that even when processing an inbound signal, ADC 43 may operate in a lower precision mode when certain information is being received.

As will be described in the descriptions associated for the subsequent Figures, ADC 43 may be placed into a lower precision mode of operation when inbound data is not being received or data requiring a higher precision resolution is not being received. ADC 43 may then be switched into a higher precision mode of operation, when inbound data is present or data requiring higher precision resolution is being received. The lower precision mode of operation allows a portion of the circuitry in ADC 43 to be deactivated or reduced in precision, so that less power is consumed during those times inbound data is not being received or data requiring higher precision is not being received.

Figure 3:
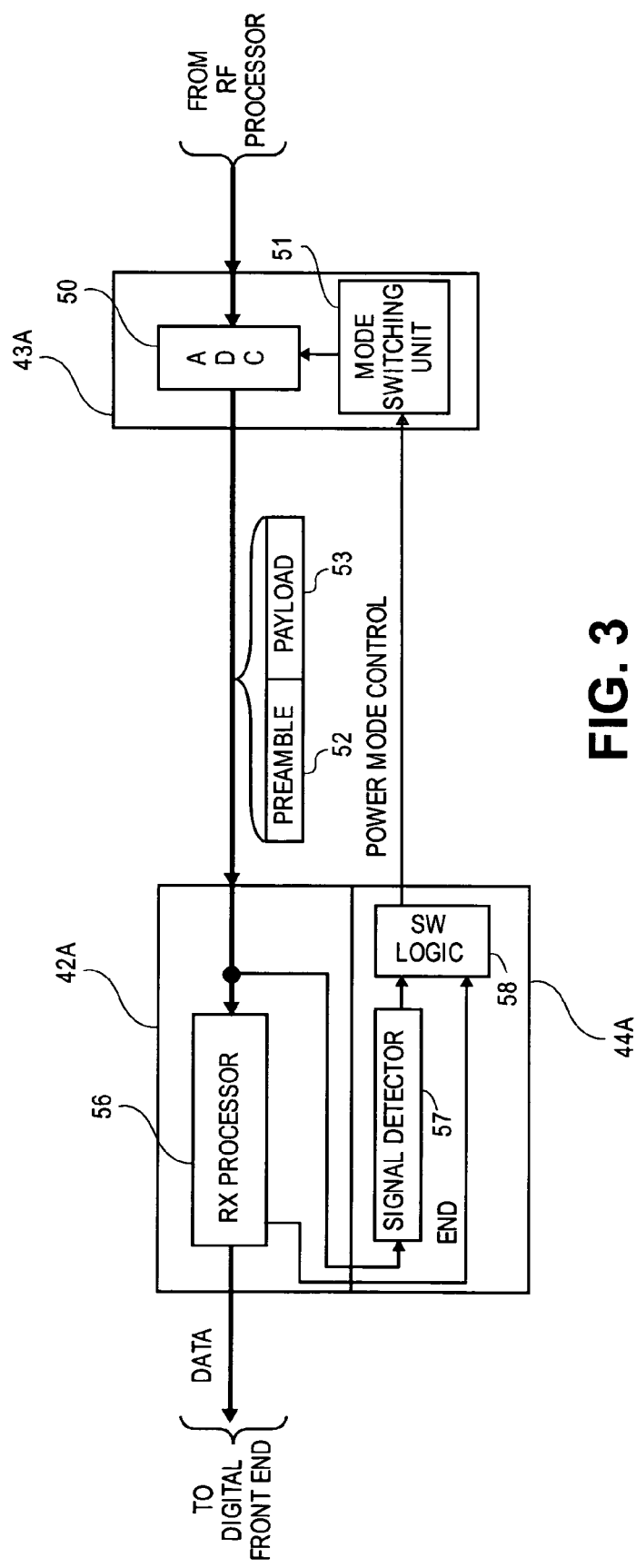
FIG. 3 is a block schematic diagram showing one embodiment for implementing an ADC that switches between different power and precision modes.

A variety of controlling schemes may be implemented to switch the ADC between two or more power modes, which are tied to the precision accorded by ADC 43. FIG. 3 illustrates one example embodiment for determining when to switch ADC from a lower power mode to a higher power mode and when to return ADC back to the lower power mode.

In the embodiment of FIG. 3, ADC 43A (which is equivalent to ADC 43 of FIG. 2) includes one or more ADC stage(s) 50 and a mode switching unit 51. Mode switching unit 51 controls the mode of operation of ADC stage 50, so that stage 50 operates in either a higher power mode or a lower power mode. Generally, the lower power mode results in a lower precision operation of stage 50 and the higher power mode results in a higher precision operation of stage 50. The data received from the RF processor stage 33 may be in packets, frames, streamed, or some other form. However, generally, there is some control, protocol or training information which precedes the actual data. The data which precedes the actual data is noted as "preamble" data 52 in FIG. 3. The actual data to be converted for use is noted as "payload" data 53. When converting received data from analog to digital format in ADC 43A, higher precision in conversion is generally applied at least with the payload. Since the preamble is used to set up for the subsequent incoming payload data, higher precision in conversion may not be necessary in detecting the start of the preamble. Accordingly, switching of the ADC stage(s) 50 between modes of operation is achieved based on detecting the start of the preamble for the first mode change and the end of the reception of the payload to return to the initial mode of operation.

Rx module 42A (which is equivalent to Rx module 42 of FIG. 2) receives the converted digital signal from ADC 43A and processes the data in Rx processor 56 for output to digital front end 31. The converted digital signal is also coupled to a signal detector 57 of ADC power control circuit 44A (which is equivalent to ADC power control circuit 44 of FIG. 2). Signal detector 57 monitors the input to Rx module 42A and detects when a preamble is sent from ADC 43A to initiate the first mode change. A signal, shown as signal END, from Rx processor 56 indicates when the payload reception has been completed in Rx processor 56 for the other mode change. Output from detector 57 and the END signal are coupled to switching logic 58. Switching logic 58 generates the power mode control signal to mode switching unit 51 to effect the mode changes. Switching logic 58 may be comprised of any of a variety of gates or circuits to cause state changes of the power mode control signal in response to the signal detector 57 output and the END signal.

It is to be noted that prior to the presence of the preamble 52, ADC 43A had been in a lower power-lower precision mode of operation. When preamble 52 is detected by detector 57, indicating an inbound signal, switching logic 58 changes the power mode control signal to cause mode switching unit 51 to place ADC stage 50 into a higher power-higher precision mode of operation. This switching allows ADC stage 50 to process the inbound data in the higher power-higher precision state. It is to be noted that generally, ADC stage 50 is switched into the higher power-higher precision state to receive the remaining portions of preamble 52 in the higher power-higher precision state. As to how rapidly the mode change is achieved, once the start of the preamble is detected, depends on the circuitry employed. At least, ADC 50 is fully in the higher power-higher precision mode by the time payload 53 is received.

Once payload 53 reception is completed, Rx processor 56 through logic 58 may now change the state of the power control signal to unit 51 to place ADC stage 50 back into the lower power-lower precision state. The ADC stays in this mode until detector 57 detects the next preamble 52, at which time the cycle is repeated. Accordingly, by maintaining the ADC 43A in a lower power-lower precision state during periods when inbound data is not present (or at least when higher precision resolution is not needed), lower power consumption may be achieved in the ADC 43A. However, when the higher precision operation is to be utilized with the conversion of inbound data, ADC 43A is switched into the higher power-higher precision state.

Figure 4:
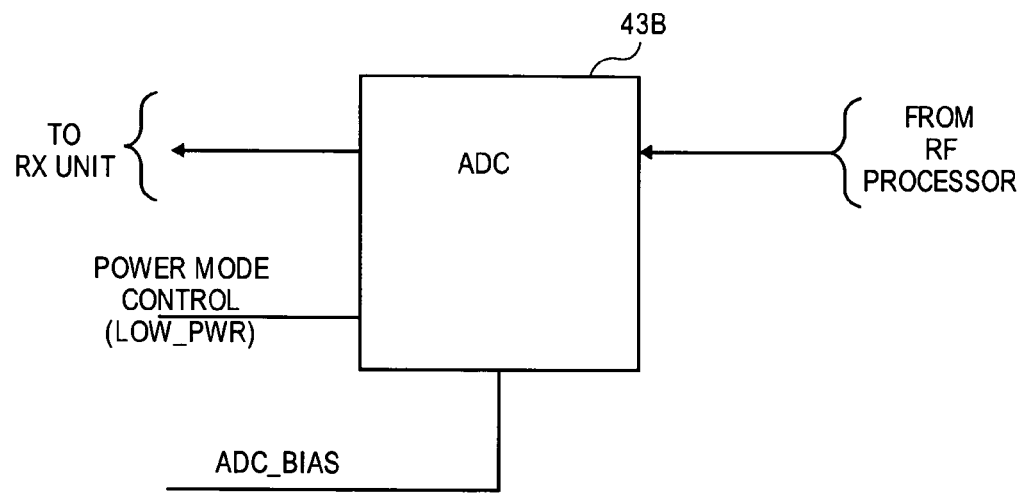
FIG. 4 is one embodiment of an ADC that switches between high power-high precision and low power-low precision modes of operation based on inbound data.

Referring to FIG. 4, another embodiment for practicing the invention is shown. In FIG. 4, ADC 43B (which is equivalent to ADC 43 or 43A), receives a power mode control signal designated LOW_PWR (low power) from an ADC power control circuit, such as circuit 44 or 44A. The state of the LOW_PWR signal controls the state of ADC 43B. Thus, the state of LOW_PWR determines if ADC 43B is in the low power-low precision mode or the high power-high precision mode. A line designated as ADC_BIAS may be utilized to set the current value for ADC 43B.

In the high power-high precision mode, current available to converter stage(s) of ADC 43B is set to a predetermined value, which in one embodiment is set by ADC_BIAS. When data reception ends, such as when the payload reception is completed, LOW_PWR changes its state to place ADC 43B into a low power-low precision state. In one embodiment, the low power-low precision mode may be achieved by deactivating (turning off) one or more stages of ADC 43B. One such technique to deactivate stages of ADC 43B is later described in reference to FIG. 6. With one or more stages of ADC 43B deactivated, the precision of the ADC conversion is reduced, however, less power is consumed. Subsequently, when the next received signal is detected, such as by the detection of another preamble, LOW_PWR again changes state to place ADC 43B into the high power-high precision mode of operation, until the payload has been received.

Figure 5:
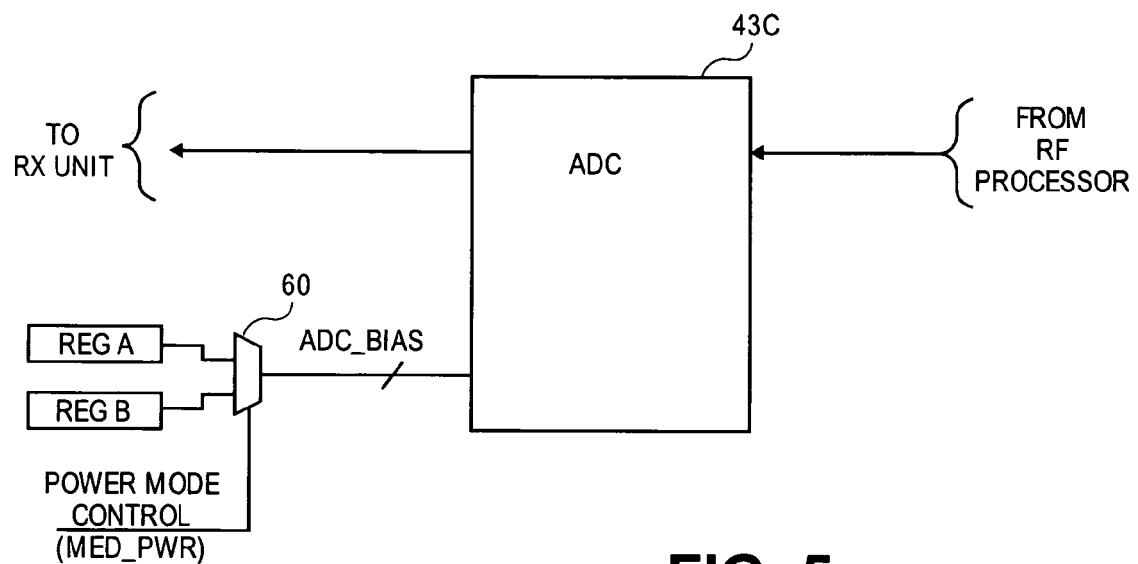
FIG. 5 is one embodiment of an ADC that switches between high power-high precision and medium power-medium precision modes of operation based on inbound data.

FIG. 5 shows another embodiment for practicing the invention. In FIG. 5, ADC 43C (which is also equivalent to ADC 43 or 43A), receives an ADC_BIAS signal of n bits. In this embodiment, power mode control signal MED_PWR (medium power) is used as a select signal to select one of the inputs of multiplexer (mux) 60 as signal ADC_BIAS at the output of mux 60. Mux 60 selects from a value stored in one or more registers. In the example embodiment of FIG. 5, two registers (designated as Reg A and Reg B) are used to store respectively a high power value and a medium power value. Thus, the particular state of MED_PWR selects if the high current value or the medium current value is sent as ADC_BIAS to ADC 43C to set the bias for the operational current of ADC 43C.

When only two values are utilized, the high current value may be selected to operate ADC 43C in a high power-high precision mode. The medium current value may be selected when ADC 43C is to operate in a medium power-medium precision mode. The term medium power-medium precision is utilized herein to distinguish this mode of operation from the low power-low precision mode of operation. In the low power-low precision mode of operation noted in FIG. 4, certain converter stage(s) of ADC 43B is/are deactivated (or at least removed from the analog-to-digital conversion operation). In the medium power-medium precision mode of operation noted in FIG. 5, the converter stages of ADC 43C remain active, but at a lower current value so that the power consumption is reduced. Generally, the medium power-medium precision mode operates at a higher power consumption than the low power-low precision mode, but the precision of the ADC is higher.

It is to be noted that the circuit of FIG. 5 may employ more than two registers. For example, if four registers are utilized, three different medium power-medium precision levels may be available for selection. For example, in one embodiment, if the ADC_BIAS value for the high power-high precision mode is set at 100% of a full current value for the ADC, the three medium levels may be set to 33%, 50% and 66% of the full current value. Such flexibility in selection of the ADC_BIAS value may be desired, in the event ADC 43C is designed to receive data using different communication protocols where the precision required for the detection of the preamble may differ based on the protocol being used. In addition, it is to be noted that one or more of the registers may be programmable, so that bias values may be programmed into the register(s).

Although only two examples are shown in FIGS. 4 and 5, it is readily evident that other techniques may be employed to perform the operation of switching an ADC between two or more modes of operation. Generally, one mode is designated as the higher power-higher precision mode in which inbound data is received and converted by the ADC. The other mode or modes (whether termed low power-low precision, medium power-medium precision or some other designation) is/are used when the higher precision mode is not needed by the ADC and a lesser precision conversion is acceptable. The lesser precision mode of operation typically consumes less power than the higher precision mode of operation. Furthermore, in some applications, a baseband processor may employ or have the ability to provide all three modes (high, medium and low precision) of operation. Accordingly, the invention is not limited only to the example embodiments described herein.

Figure 6:
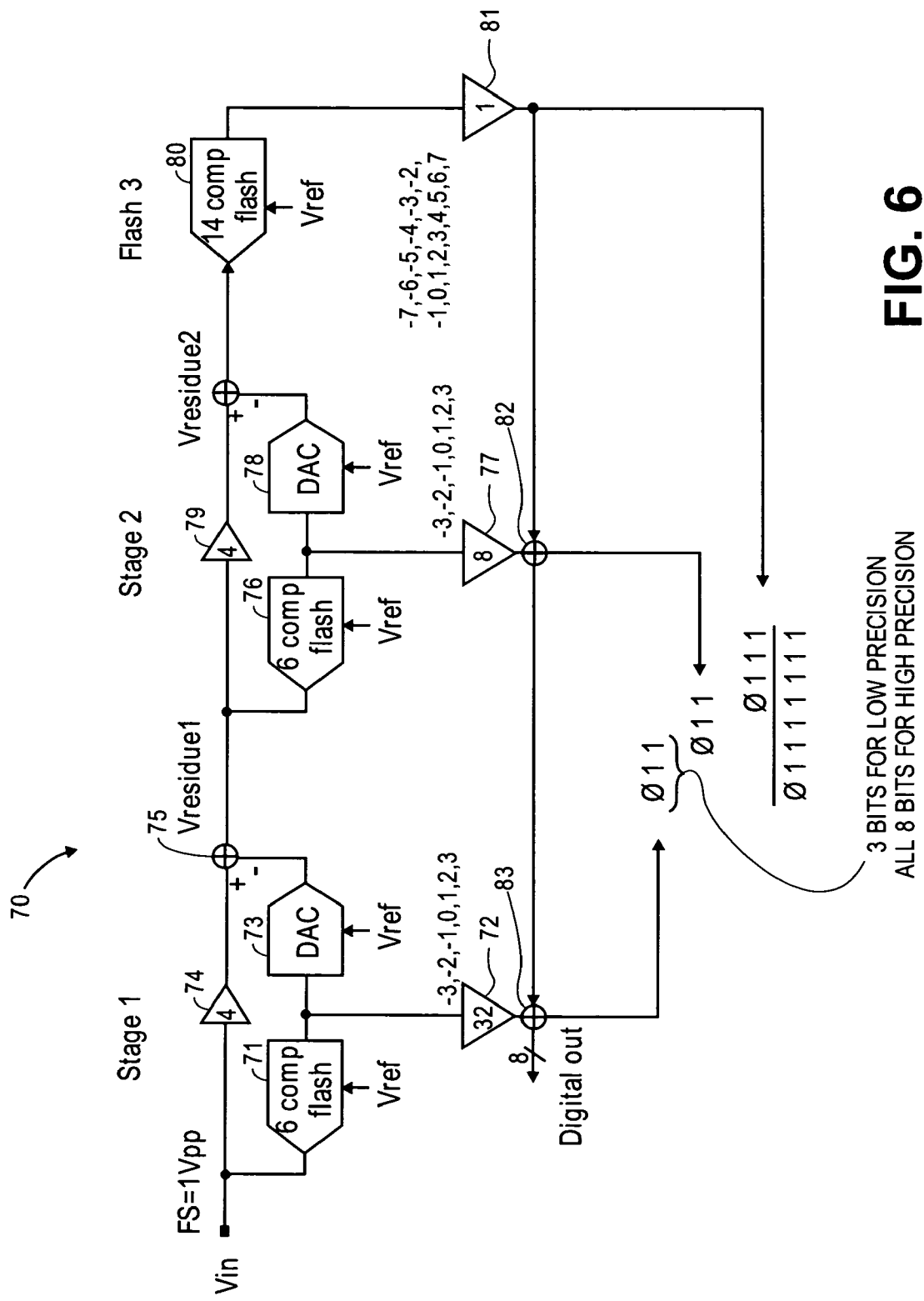
FIG. 6 is one embodiment of an ADC circuit utilized for the ADC of FIG. 4, in which one or more stages of the ADC circuit is deactivated in the low power-low precision mode.

As noted, different techniques are available to implement various embodiments of the invention. FIG. 6 illustrates one circuit to implement the low power-low precision ADC 43B of FIG. 4. A pipeline ADC circuit 70 is comprised of three pipelined stages, noted as Stages 1, 2 and 3. In this particular embodiment, a full-scale (FS) analog input to the ADC is defined as 1 volt peak-to-peak and the digital output from the ADC is eight bits. Stage 1 is comprised of a 6 comparator flash ADC converter 71, which receives the analog input Vin and generates seven levels (−3, −2, −1, 0, +1, +2, +3) of comparison. The output of converter 71 is multiplied by multiplier 72 and output as a 3-bit digital signal. In the particular embodiment, multiplier 72 has a multiplying factor of 32. The term flash is used herein to designate a very fast converter unit.

The output of converter 71 is also input to a digital-to-analog converter (DAC) 73 to generate an analog voltage at summation node 75. The input voltage Vin is amplified by amplifier 74 and combined at summation node 75. In the particular embodiment, amplifier 74 has a gain factor of 4. The difference of the two voltages at summation node 75 is noted as the residual voltage Vresidue1. Vresidue1 is coupled as input to Stage 2.

Stage 2 is arranged similarly to Stage 1 in that 6 comparators are employed in ADC flash converter 76. The output of the converter is sent to multiplier 77 and DAC 78. Again, 3 bits are obtained at the output of multiplier 77. The Vresidue1 value is amplified by amplifier 79 and a difference of its output and the output of DAC 78 are obtained at summation node 79 to generate a Vresidue2 voltage for input into Stage 3. In the particular embodiment, multiplier 77 has a multiplying factor of 8 and amplifier 79 has a gain factor of 4.

Stage 3, being the last stage only has ADC converter 80, which is a 14 comparator flash unit, having 15 levels (−7, −6, −5, −4, −3, −2, −1, 0, 1, 2, 3, 4, 5, 6, 7). The output of converter 80 is input to multiplier 81, which has unity multiplying factor in this embodiment. The output of multiplier 81 is a 4-bit digital signal. Summation nodes 82 and 83 combine the outputs of multiplier 81, 77, 72 to generate the digital output from circuit 70.

As shown in the bit summation diagram, Stage 1 processes Vin and generates the most significant 3 bits. Stage 2 provides the next 3 bits, but Stage 2's most significant bit (msb) is combined with the least significant bit (lsb) of Stage 1. Stage 3 provides the next 4 bits, but Stage 1's msb is combined with the lsb of Stage 2. The final output of combining the 10 output bits is the 8-bit representation of the input signal Vin.

It is to be noted that in one example embodiment for practicing the invention, all three stages are utilized to generate 8 bits of data when in the high power-high precision mode of operation. However, when the ADC is switched to the low power-low precision mode of operation, Stage 2 and Stage 3 are turned off (deactivated) and the effective output from circuit 70 is the 3-bit output of Stage 1. Thus, in the low power-low precision mode, the precision is that provided by Stage 1 only. A place holder value (such as "0"), may be inserted for the output of Stages 2 and 3, so as to still generate an 8-bit digital value, but the effective number of bits for determining precision is only 3. The deactivation of Stages 2 and 3 reduces power consumption in the low power-low precision mode of operation.

It is to be noted that circuit 70 is but one implementation and other circuits may be readily adapted for turning off certain portions of the ADC in the low power-low precision mode. The higher precision is used to obtain a higher effective number of bits (ENOB) for the input signal when payload data is being input to circuit 70. However, when signal detection of a preamble may be achieved with a lower ENOB, the three msbs from Stage 1 may be adequate to detect the presence of the start of the preamble data. In other embodiments, Stage 1 and 2 may be retained active in the low power-low precision mode if higher ENOB is needed for preamble detection.

Figure 7:
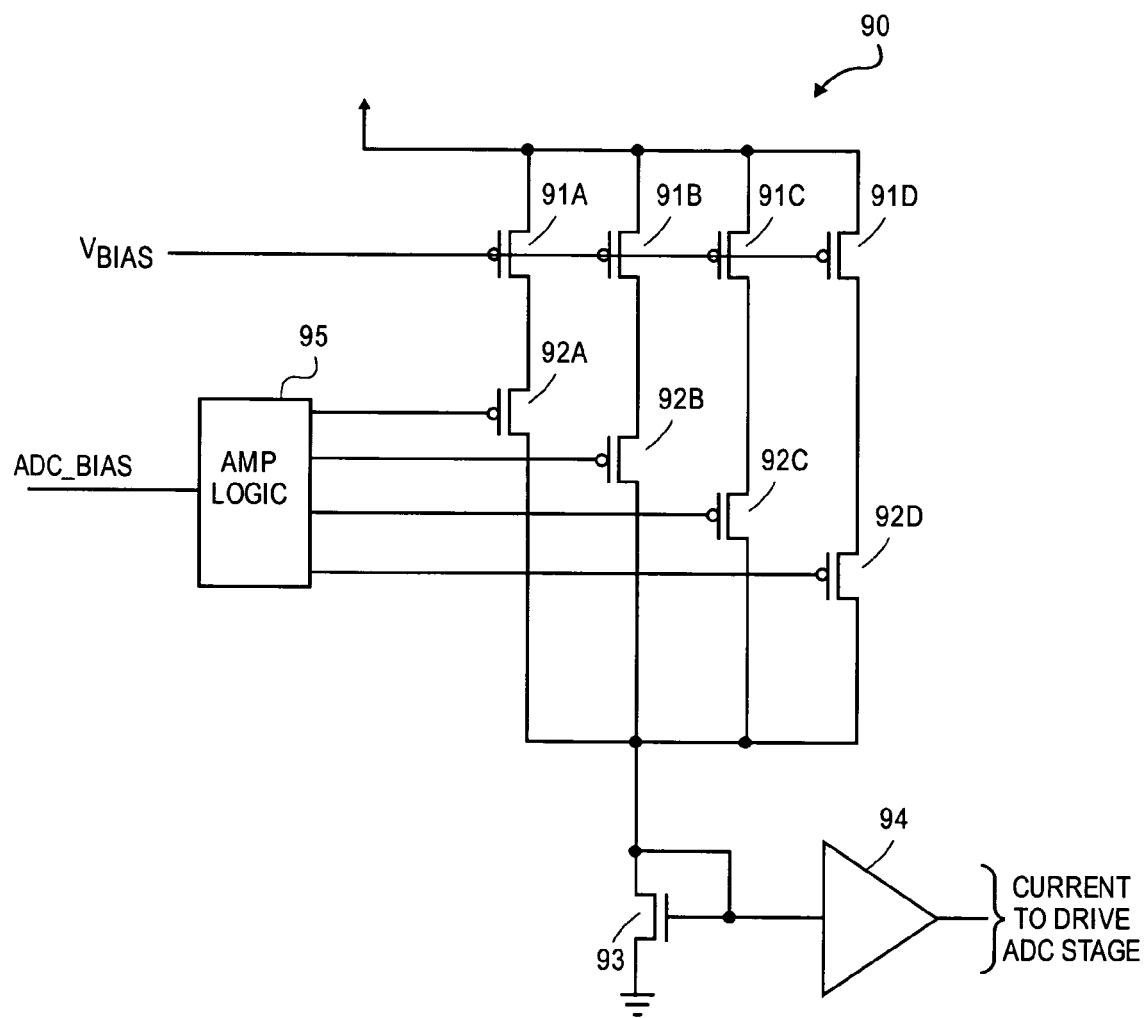
FIG. 7 is one embodiment of a current drive circuit for an ADC of FIG. 5, in which one or more branches of the current drive amplifier is/are turned off in the medium power-medium precision mode.

FIG. 7 illustrates one circuit to implement the medium power-medium precision ADC 43C of FIG. 5. Circuit 90 is employed to control the amount of current available to drive (or bias) a stage of an ADC, such as ADC 43. In the particular embodiment, circuit 90 has four current branches (or legs), which may be activated/deactivated individually. A p-type transistor 91A-D reside respectively in the branches and couples to a common n-type transistor 93, which is used to drive amplifier 94. Gates of transistors 91A-D are coupled to $V_{BIAS}$ to set the gate bias. Additionally, P-type transistors 92A-D reside respectively in the branches and the turned-on or tuned-off state of respective transistors 92A-D determines if a particular branch is activated.

The signal ADC_BIAS is coupled to amplifier logic 95. ADC_BIAS, when decoded by amplifier logic circuit 95, determines which of transistors 92A-D are to be turned on to conduct current through the corresponding branch. The total current drive (or bias) for the ADC stage is obtained at the output of amplifier 94 and that value depends on the summation of the currents through the branches which are active. Thus, by selecting the value to be sent by ADC_BIAS, current drive to the ADC stage may be controlled. As noted in FIG. 5, values for ADC_BIAS may be programmed into the registers.

In one embodiment, all four branches are activated to provide full current when in the high power-high precision mode. When the ADC is to switch to the medium power-medium precision mode, one or more of the branches may be turned off, or the bias adjusted to reduce the current flow in one or more branches. When less current is available to drive the ADC stage, less power is consumed. However, the slew rate may be reduced in the ADC stage, so that the conversion process may introduce additional errors which may reduce the precision of the ADC. Again, such lower precision may be acceptable for detecting the presence of the preamble.

In another embodiment, circuit 90 is employed to provide three different medium power-medium precision modes. In the high power-high precision mode, all four of the branches are active. The next lower medium precision mode has only three branches active. The next level below has only 2 branches active and the lowest medium precision mode has only one branch active. The branches may be designed so that current drive in the medium precision mode may have the current values of 66%, 50% and 33% of full current (at high precision). Thus, by using the ADC_BIAS signal, ADC stage current may have 100%, 66%, 50% and 33% of full value, depending on the number of branches that are selected active. Again, in some embodiments, the branches need not shut down completely, but may have the bias reduced to reduce the current flow.

Furthermore, it is to be noted that other embodiments may have more or less than four branches to vary the ADC drive current. Also, ADC 43C may utilize multiple stages, so that circuit 70 or its equivalent, may be employed in each of the stages. The control of the stages may operate in unison to turn on/off a corresponding branch or branches of the different stages. Alternatively, other branches in separate stages may be controlled independently. What is to be noted is that the drive (or bias) current of the ADC is reduce during times payload data is not being processed by the ADC. It is possible that the reduced current drive may reduce the precision (ENOB) of the ADC. However, a certain medium precision level may be selected at medium power to effectively detect the incoming preamble data to switch the ADC to the high power-high precision mode.

Figure 8:
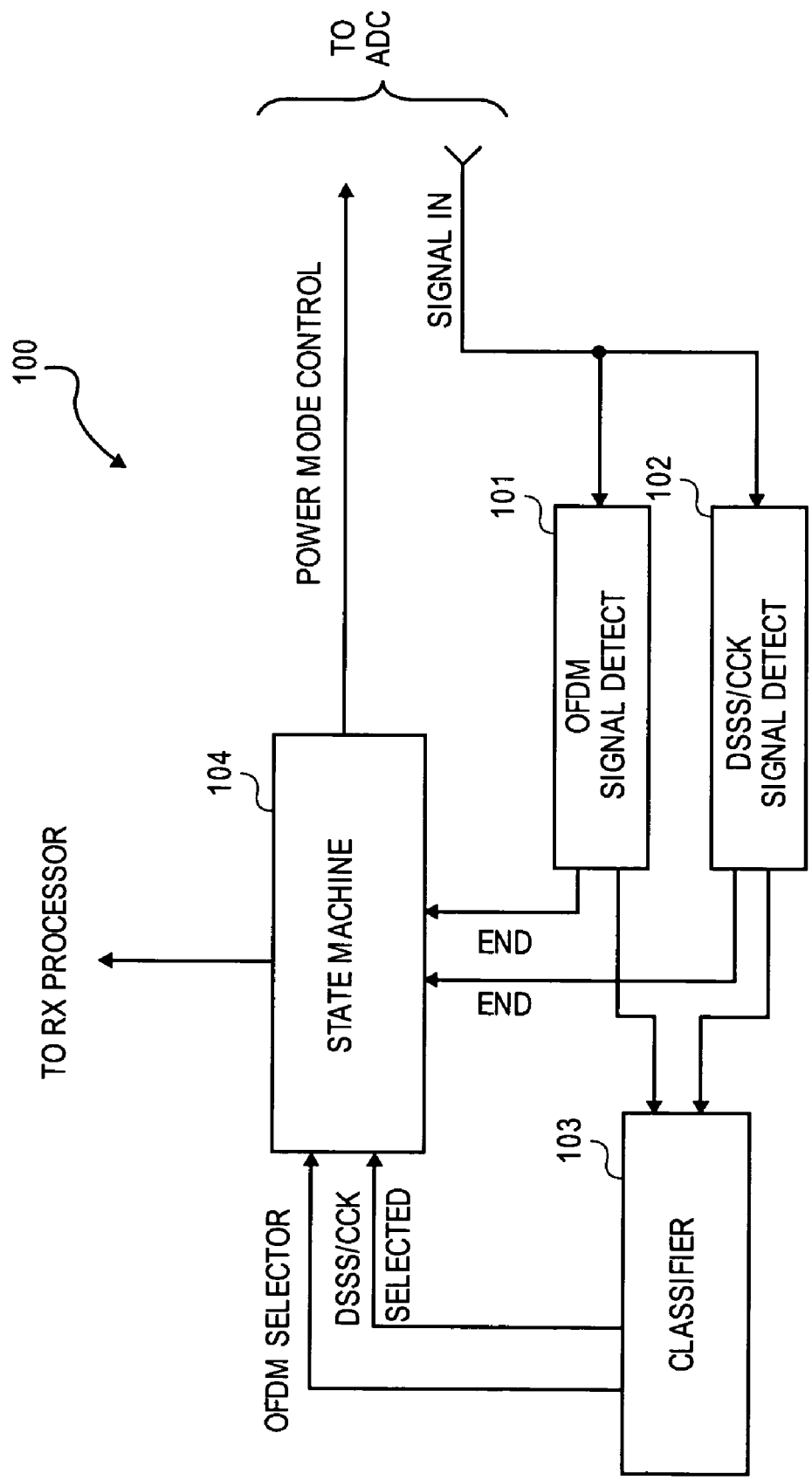
FIG. 8 is a block schematic diagram for implementing an example signal detector to detect inbound OFDM and DSSS/CCK signals to switch an ADC into a high power-high precision mode of operation.

Although a variety of different wireless applications may utilize the ADC embodiments described above, one application is shown in FIG. 8. In FIG. 8, a circuit 100 is shown as one embodiment for implementing a signal detector, such as detector 57 of FIG. 3. In this example, a wireless communication device (such as device 30 of FIG. 1) is set to receive either 1) OFDM (Orthogonal Frequency Division Multiplexing) signal at approximately 5 GHz; or 2) DSSS/CCK (Direct Sequence Spread Spectrum/Complementary Coded Keying) signal or OFDM signal at approximately 2.4 GHz. Accordingly, circuit 100 includes an OFDM signal detector 101 and DSSS/CCK signal detector 102 to detect the respective signals. When a preamble data for one of the two protocols is received from the ADC, one or the other of the detectors 101, 102 sends a signal to a classifier to classify the incoming data. Classifier 103 generates a signal indicating the protocol of the inbound data to state machine 104. State machine 104 then sets the Rx module to provide the appropriate processing for the inbound data. State machine 104 also generates the power mode control signal to control the mode of operation of the ADC.

Thus, when the start of the preamble of the inbound data is detected, state machine 107 causes the power mode control signal to place the ADC into a high power-high precision mode of operation to convert the following data. Subsequently, when the payload conversion is completed, detector 101 or 102, generates an END signal to state machine 103 to switch the power mode control signal, so that the ADC reverts back to the lower power mode, whether that lower power mode is the low power-low precision mode or the medium power-medium precision mode. Therefore, data utilizing different wireless communication protocols may be received by a communication device implementing an embodiment of the present invention. It is to be noted that this is but just one example and that other implementations are readily available for practicing the invention.

Thus, a scheme to switch an ADC between two or more power consumption modes is described, wherein the ADC may operate in a lower power mode but switches to a higher power mode to improve the precision of the conversion of the inbound data when such a higher precision is desired. In the various examples described in this disclosure, specific details have been provided, such as particular circuits, communication protocols and modes of operation. However, these are examples only and other embodiments may be readily implemented to practice the invention.

We claim:

1. An apparatus comprising:
    means for converting received data from an analog format to a digital format, in which the received data has a preamble portion and a payload portion, and in which the same means for converting is to convert both the preamble and payload portions; and
    means for switching between a first mode of operation and a second mode of operation in the same means for converting to convert the data, in which the first mode of operation converts the data at higher precision than the second mode of operation in the means for converting, but the first mode of operation consumes more power than the second mode of operation, the means for switching to switch the means for converting to the first mode of operation when the preamble portion preceding the payload portion identifies that the payload portion following is for higher precision conversion.

2. The apparatus of claim 1, wherein the means for switching to switch the means for converting to the second mode of operation after completion of higher precision conversion of the payload portion of the data.

3. The apparatus of claim 2 further includes means for detecting presence of the preamble portion identifying the higher precision payload, wherein upon detecting the preamble portion identifying the higher precision payload, the means for detecting signals to the means for switching to switch to the first mode of operation.

4. The apparatus of claim 3, wherein the means for converting to deactivate one or more stages of data conversion when in the second mode of operation to consume less power.

5. The apparatus of claim 3, wherein the means for converting to reduce current drive for data conversion when in the second mode of operation to consume less power.

6. An apparatus comprising:
    an analog-to-digital converter (ADC) to convert a data packet from an analog format to a digital format, the data packet having a preamble portion and a payload portion, in which the same ADC is to convert both the preamble portion and the payload portion; and
    a switching circuit coupled to switch the ADC between a first mode of operation and a second mode of operation in the same ADC, in which the first mode of operation converts the payload at a higher precision than the second mode of operation in the ADC, but the first mode of operation consumes more power than the second mode of operation, the switching circuit to have the ADC operate in the second mode of operation, but to have the ADC switch to the first mode of operation when the preamble portion identifies that the payload portion following is for higher precision conversion.

7. The apparatus of claim 6, wherein the ADC is switched to the second mode of operation after completion of higher precision conversion of the payload portion.

8. The apparatus of claim 7 further includes a signal detector to detect presence of the preamble portion, wherein the signal detector to generate a control signal to the switching circuit to switch the ADC to the first mode of operation upon detecting that the preamble portion identifies that the payload portion following is for higher precision conversion.

9. The apparatus of claim 8, wherein the control signal is to be utilized to deactivate one or more stages of the ADC when in the second mode of operation to consume less power.

10. The apparatus of claim 8, wherein the control signal is to be utilized to reduce current drive of the ADC when in the second mode of operation to consume less power.

* * * * *